(12) United States Patent
Stojcevic (10) Patent No.: US 7,323,884 B2
(45) Date of Patent: Jan. 29, 2008

(54) RF TEST CHAMBER

(75) Inventor: Zivota Zeke Stojcevic, Toronto (CA)

(73) Assignee: Psion Teklogix Inc., Mississauga, Ontario (CA)

( * ) Notice: Subject to any disclaimer, the term of this patent is extended or adjusted under 35 U.S.C. 154(b) by 0 days.

(21) Appl. No.: 11/323,635

(22) Filed: Dec. 30, 2005

(65) Prior Publication Data

US 2007/0164755 A1    Jul. 19, 2007

(51) Int. Cl.
*G01R 27/28* (2006.01)
(52) U.S. Cl. .................................. 324/627; 324/628
(58) Field of Classification Search .............. 324/627, 324/628
See application file for complete search history.

(56) References Cited

U.S. PATENT DOCUMENTS

| | | | | |
|---|---|---|---|---|
| 4,521,780 A | * | 6/1985 | Preikschat | 342/170 |
| 4,970,455 A | * | 11/1990 | Suzuki et al. | 324/95 |
| 5,939,982 A | * | 8/1999 | Gagnon et al. | 340/539.17 |
| 6,509,742 B1 | * | 1/2003 | Ebizuka et al. | 324/627 |

\* cited by examiner

*Primary Examiner*—Vincent Q. Nguyen
(74) *Attorney, Agent, or Firm*—Pearne & Gordon LLP (57) ABSTRACT

A system for testing radio frequency (RF) communications of a device capable of such communications is provided. The system includes a chamber for isolating the device from RF interference, an antenna that is suitable for RF communications with the device wherein the antenna is capable of communications over a range of frequencies, the antenna being located within the chamber, and a digital communication link for providing non-RF communications with the device.

16 Claims, 8 Drawing Sheets

RF TEST CHAMBER

FIELD OF INVENTION

The invention relates generally to a chamber for testing RF devices, and more particularly to a chamber that allows for testing over a spectrum of frequencies.

BACKGROUND OF THE INVENTION

The testing of RF communication devices requires an environment that is 'free' from RF "interference" that fills many current industrial and or commercial settings. This interference includes RF signals from wireless devices including cell phones, pagers, 802.11, RFID devices and Bluetooth enabled devices to list well-known devices. While the above list is not meant to be exhaustive it does present common examples of systems that generate RF signals. Testing is therefore conducted in chambers where the RF device under test can be isolated from outside interference and thus be protected from interference from the adjacent electronic devises.

An outcome of the isolation requirements is that the RF device being tested will not be able to communicate with antenna located outside of the chamber i.e. outside of the isolation. Therefore, RF test chambers require an antenna be incorporated in the chamber.

Current RF test chambers implement an antenna that is only suitable for communications over a narrow frequency bandwidth. Further current antenna designs are only suitable for small test chambers as may be suitable for the testing of single devices i.e. as in an open-air communication test.

Therefore, there is a need for an RF test chamber that can accommodate one or more devices for testing and is capable of testing devices over numerous frequencies. For example one may wish to test a device that is capable of communicating using radios that include 802.11, NB (narrow band), Bluetooth and GSM.

SUMMARY OF THE INVENTION

The present invention relates to a chamber for testing RF communications devices.

It is an object of the invention to provide an improved RF device testing chamber that mitigates or obviates at least one of the drawbacks of current test chambers.

According to an aspect of the invention a system for testing radio frequency (RF) communications of a device capable of such communications is provided. The system comprises a chamber for isolating the device from RF interference, an antenna that is suitable for RF communications with the device wherein the antenna is capable of communications over a range of frequencies, the antenna being located within the chamber, and a digital communication link for providing non-RF communications with the device.

According to another aspect of the invention use of a leaky coaxial cable as an antenna in a system for testing RF communications is provided. The antenna provides RF communications over a range of frequencies.

Other aspects and advantages of the invention, as well as the structure and operation of various embodiments of the invention, will become apparent to those ordinarily skilled in the art upon review of the following description of the invention in conjunction with the accompanying drawings.

This summary of the invention does not necessarily describe all features of the invention.

BRIEF DESCRIPTION OF THE DRAWINGS

These and other features of the invention will become more apparent from the following description in which reference is made to the appended drawings wherein.

DETAILED DESCRIPTION

The invention provides a system that is appropriate for testing one or more multi-band wireless devices.

Figure 1:
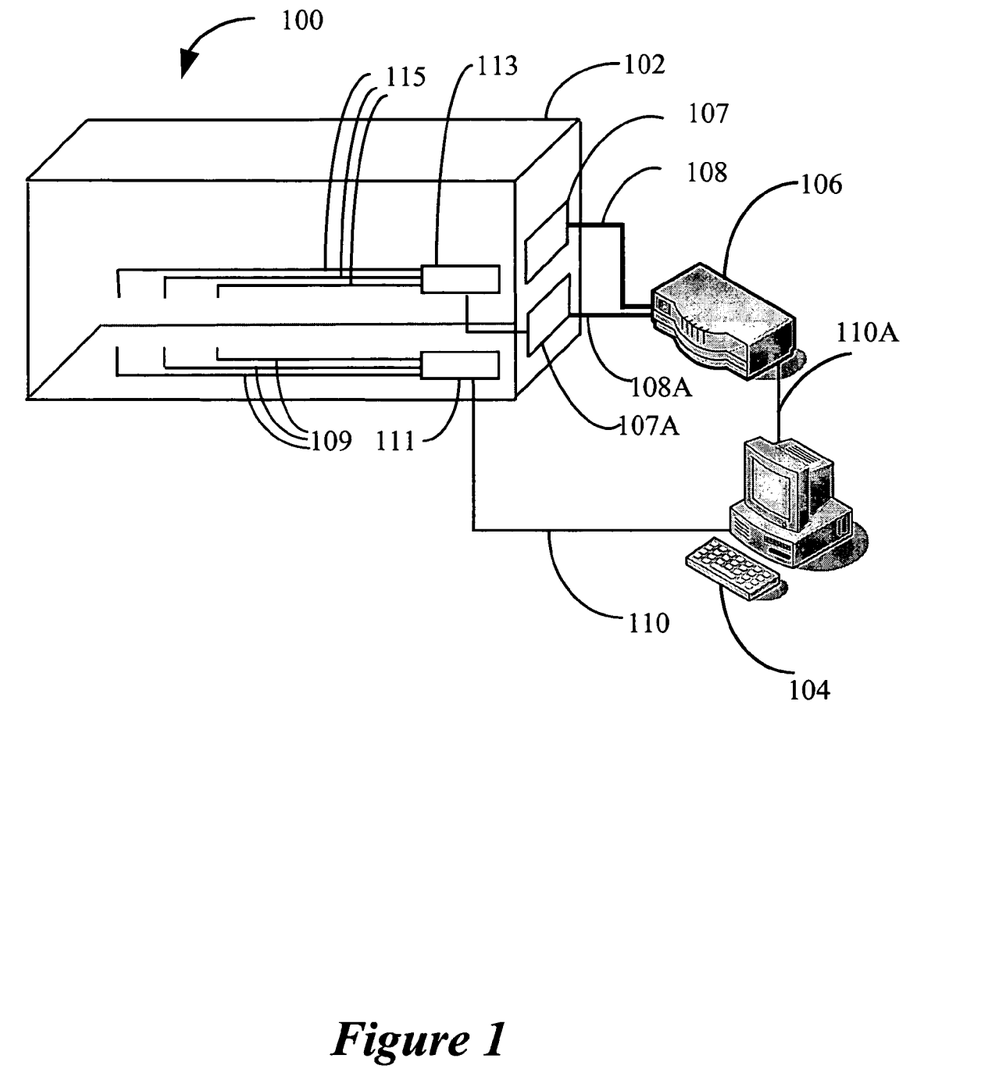
FIG. 1 is a schematic diagram of an RF test chamber and test system, in accordance with an embodiment of the invention.

The following description is of a preferred embodiment. FIG. 1 is a block diagram of the testing system 100 of the current embodiment. The testing system 100 includes a test chamber 102 having external dimensions (l/h/d) of 163/99/87 cm. The test chamber 102 is designed to accommodate multiple devices (not shown) for RF testing. The system 100 also includes a computer 104, which controls a given test (control, monitoring including control of the RF test system and monitoring of the devices being tested). This includes instructions for the generation of RF test signals, which are produced by an access point 106. The access point 106 is in-turn connected to variable attenuators 107 and 107A through RF cables 108 and 108A, respectively. In general all RF cables, including the cables 108 and 108A, are 50 ohm RGU type cables with a "floating ground".

The variable attenuators 107 and 107A and their associated circuitry are for an open and closed circuit RF communication test, respectively. The attenuators 107 and 107A are passive components in the form of manual mechanical devices, having two rotary switches for 10 and 1 dB attenuation settings used to attenuate RF signal level to and from the devise under test. Attenuation of the attenuators 107 and 107A is set to the calibrated RF signal level for RSSI minimum communication test specification level.

The attenuator 107 is connected to chamber antenna 212 and the attenuator 107A is connected to an eight to one power splitter/combiner 113 for connecting units to a closed circuit system. The splitter 113 is then connected to an 115

RF cable that is connected to the antenna port of devices under test during a "closed circuit" test i.e. the chamber antenna is not used. The devices under test are connected to the computer 104, where the devices are first connected to a hub 111 with RS232 cables 109 and the hub 111 is connected to the computer 104 using digital cable 110. The devices that are being tested are connected to the hub 111.

Figure 2:
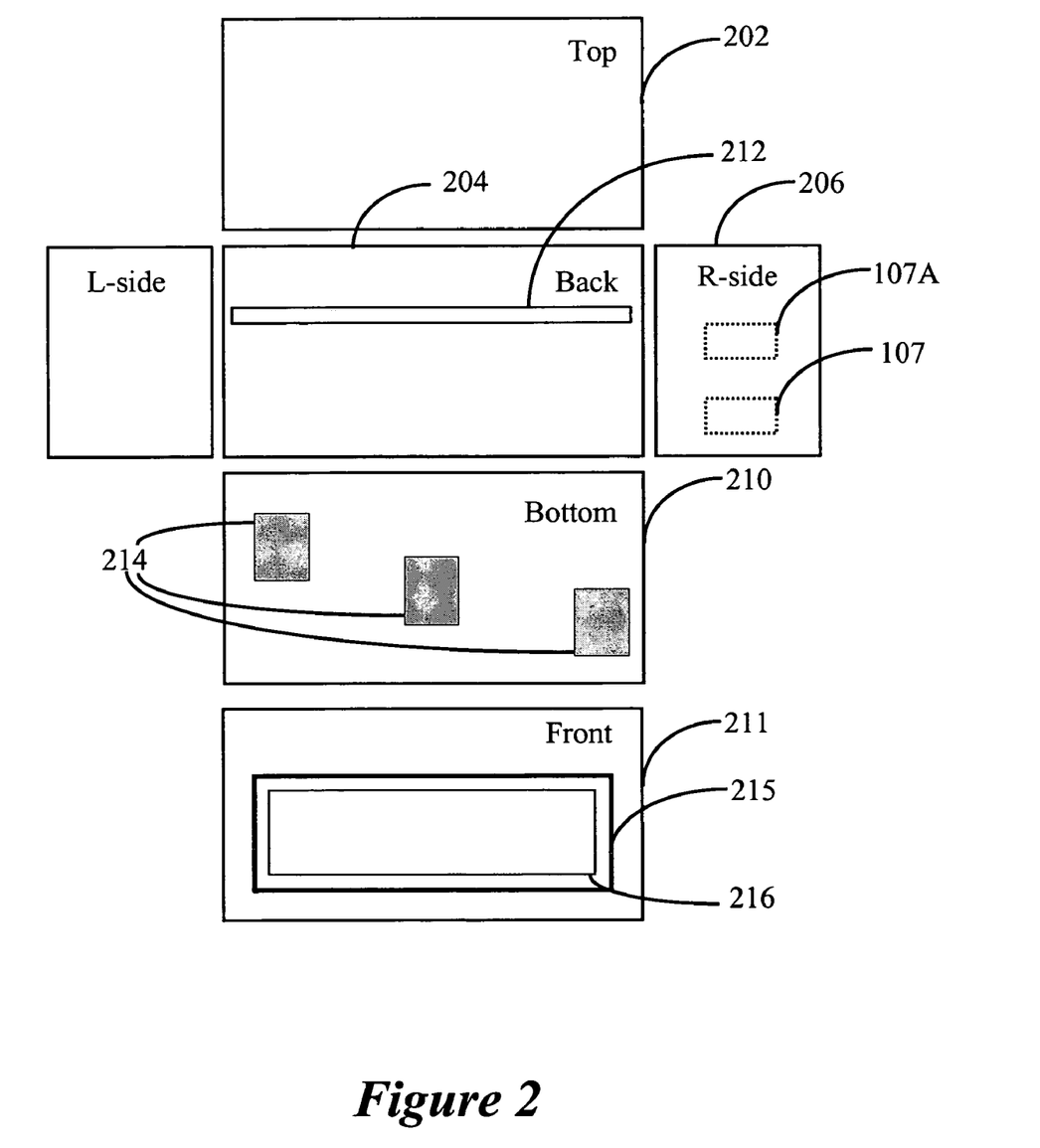
FIG. 2 is a schematic diagram of the chamber wall panels in accordance with a further embodiment of the invention.

FIG. 2 is a schematic diagram of the test chamber where the various panels are shown as if looking at the side of the panel that faces the inside of the chamber 102. The back panel 204 has antenna 212 affixed thereto. The antenna 212 is positioned in the upper half of panel 204. The right-side panel 206 has variable attenuators 107 and 107A affixed to the outside surface thereof. The bottom panel 210 has test jigs 214 located thereon. In the current embodiment there are eight test jigs, with three test jigs 214 being shown in FIG. 2. The test jigs 214 are appropriate for the reception of devices for testing and are movable on the bottom panel 210. A front panel, 211 includes a door 215 and window 216, where the door 215 provides access to devices when it is open. The door 215 is attached to the front panel 211 with hinges (not shown) and opens vertically with the aid of two pneumatic suspensors (not shown). Finally the door is provided with a lock system that secures the door in both an open and closed position. The walls of the chamber could be welded or joined with the proper shaped metal bars. All sides of the chamber 102 are properly grounded and have a common ground point, which is connected to the test equipment common ground.

Figure 3A:
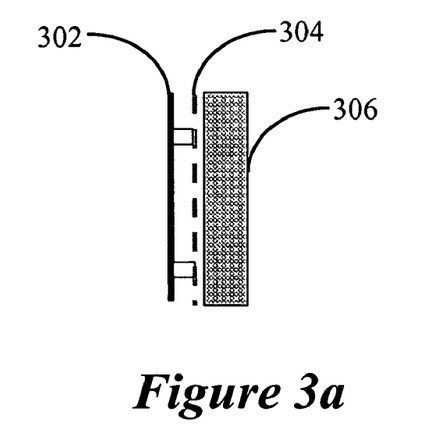
FIG. 3a is a schematic diagram of the cross-section of a chamber wall panel in accordance with a further embodiment of the invention.
Figure 3B:
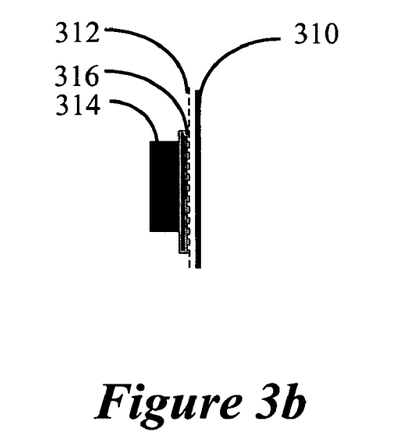
FIG. 3b is a schematic diagram of the cross-section of the chamber door in accordance with a further embodiment of the invention.

Details of the panel construction are presented in FIGS. 3a and 3b with FIG. 3b showing the construction of the front door panel 215. All other panels are constructed as shown in FIG. 3a.

The panels of the current embodiment are double shielded. The outermost layer 302 of the panel is a solid aluminum sheet. In an alternative embodiment this layer may be made of solid steel. A layer of copper mesh 304 is located adjacent to the inside surface of the layer 302. In this structure the layers 302 and 304 are connected to a common ground point. A layer of RF absorber 306 is located adjacent to the insider surface of the layer 304 thereby forming the innermost layer of the panel. The absorber 306 is a standard absorber that will cover the required frequency range. In the current embodiment this absorber covers a frequency range that extends from UHF to 3 GHz. Typically the RF absorbers 306 have dimensions of 60×60×10 cm each.

In an alternative embodiment the panels may be single shielded. In this embodiment the copper shield 304 is not installed. The cooper shield 304 of the door panel is not changed in this embodiment.

The door panel 215 is shown in FIG. 3b. It is a double-shielded multi-layer structure. A solid aluminum sheet 310 is located on the outside of the panel. Copper mesh 312 is located adjacent to the sheet 310. RF absorber 314 is located on the innermost side of the panel. Layer 316 is an optional metal plate that may be used in an alternative embodiment to ensure placement of the RF absorber.

Figure 3C:
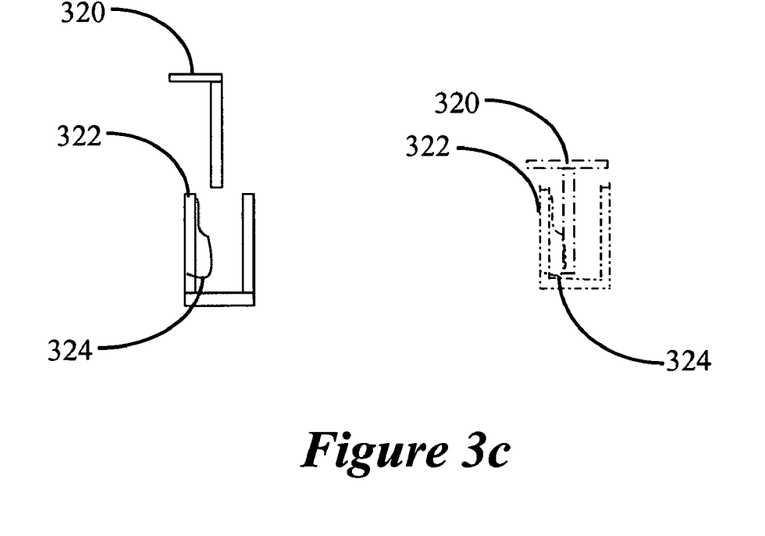
FIG. 3c is a schematic diagram of the cross-section of the chamber door RF sealing structure in accordance with a further embodiment of the invention.

The door 215 must also be provided with an RF "seal". The structure used for this seal is depicted in FIG. 3c. An "L" shaped metal bar 320 is fitted around the inside of the door 215. A "U" shaped metal structure 322 is around the front panel 216 such that the "L" bar 320 fits therein when the door 215 is closed. Another element of the RF seal is copper ground 'fingers' 324 that are located within the structure 322. As depicted in FIG. 3c the ground fingers 324 fit snugly about the rod 320 when it is lowered into the structure 322. A ground contact is thereby made with the door 215 and an RF seal is formed.

Figure 4:
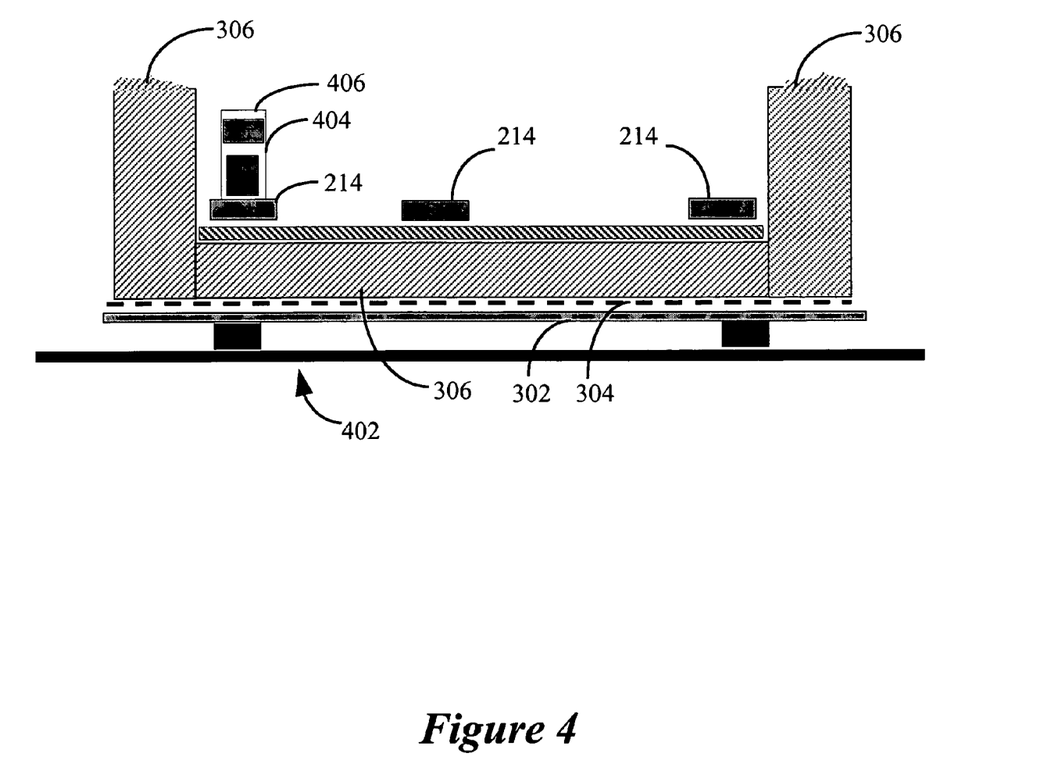
FIG. 4 is a schematic diagram of the cross-section through the bottom panel in accordance with a further embodiment of the invention.

FIG. 4 presents a section through the bottom panel illustrating the solid metal panel 302, the copper mesh 304 and the RF absorbers 306. Three device holders 214 are shown on top of the RF absorber 306 of the bottom panel structure. The device holders 214 may also be referred to as jigs 214. Devices to be tested 404 are inserted into the jigs 214.

The devices 404 have an internal antenna (not shown). This internal antenna may be on a separate printed circuit board on the same printed circuit board as the PC card (not shown) on which the radio is located. If the antenna is separate from the radio card it is connected thereto using an RF cable. In an "open-air" test the internal antenna will communicate with the chamber antenna 212. During a closed circuit test the devices 404 will be connected to the access point 106 via RF cables 115 that are connected to the devices 404 via the antenna access point 406.

When the devices 404 are inserted in the jigs 214 they are connected to and in data communication with the test PC 104 via RS 232 cables 109, which are connected to the test jigs 214. This digital connection is present when during both the open air and closed circuit test.

Antenna

A central aspect of the current embodiment is the antenna 212. The antenna 212 provides RF coverage for the chamber 102 over a range of frequencies. The antenna 212 is a 50 Ohm leaky coaxial cable. In the current embodiment a FlexRad™-600 flexible low loss communication Coax is used as a Short Antenna feeder run. Other similar antenna that provide for similar operation will be apparent to those of skill in the art. The antenna 212 offers broadband performance up to 3 GHz. In the current embodiment the antenna 212 provides for RF coverage between about 400 MHz and about 3 GHz.

As illustrated in FIG. 2 the antenna 212 is in the form of a straight line and is placed on the back panel 204 of the test chamber 102. The antenna 212 of the current embodiment has a length that is equal to the length of the chamber 102 i.e. length of the rear panel 204. Without being limited by theory it is currently understood that the minimum length of the antenna 212 is equal to a fraction of the wavelength of the lowest frequency of the test. Further, the antenna 212 is positioned within the chamber 102 such that the distance between the antenna 212 and the device antenna 406 is at least equal to a function of the highest and lowest chamber operating frequency wavelength.

The RF coverage can be improved through RF tuning of the antenna 212. In the current embodiment tuning is accomplished by repositioning the device 404 within the test chamber 102. The repositioning may include vertical movement of the device 404 in the jig 214 in which it is inserted or horizontal movement of the jig 214 within the chamber 102. This tuning will thereby provide for the desired distance between the antenna 212 and the device antenna 406.

Operation

It is an object of the invention to provide an integrated test environment where a device can be tested in both a closed circuit and open-air environment over a variety of frequencies. Further the tests can be performed without having to remove the device 404 from the test chamber 102. This therefore provides for a simplified testing procedure. A closed circuit test might test for parameters including modulation, conducted spurious and receiver sensitivity. Other parameters that might be tested in a closed circuit test will be apparent to those of skill in the art. Testing of these parameters is a common way of verifying the operation of a device 404 without using the device antenna 406. Further use of closed circuit testing allows the reduction of interference so these parameters are tested under a controlled testing condition.

The operation of the device antenna 406 radiated test parameters that could not be tested in a closed circuit test can be tested by means of an open-air test. In such a test the device antenna 406 communicates with the chamber antenna 212, which in-turn is connected to the access point 106.

Figure 5A:
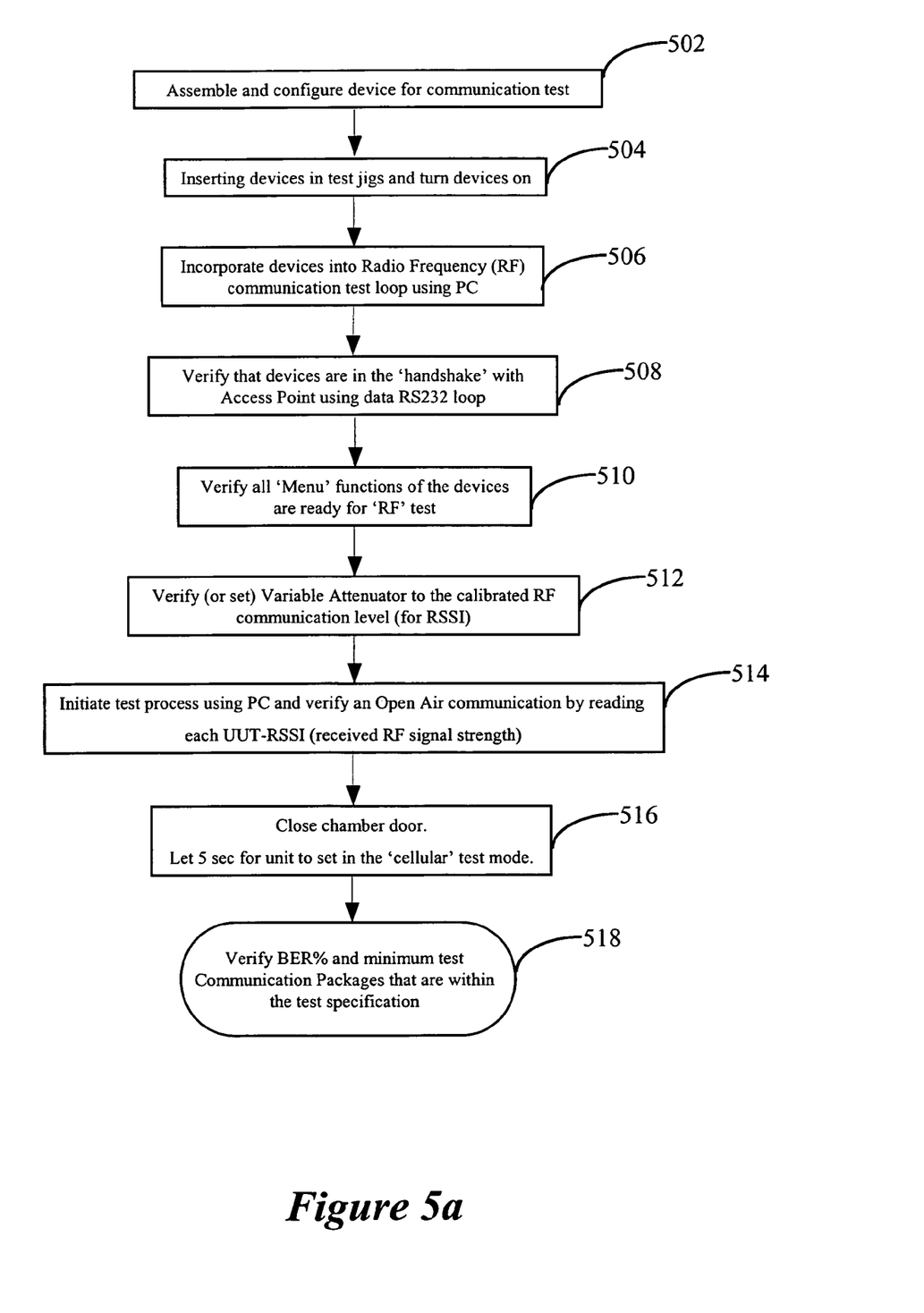
FIG. 5a is a flow chart of a pre-test set-up procedure for a test using an internal or integrated antenna in accordance with a further embodiment of the invention.
Figure 5B:
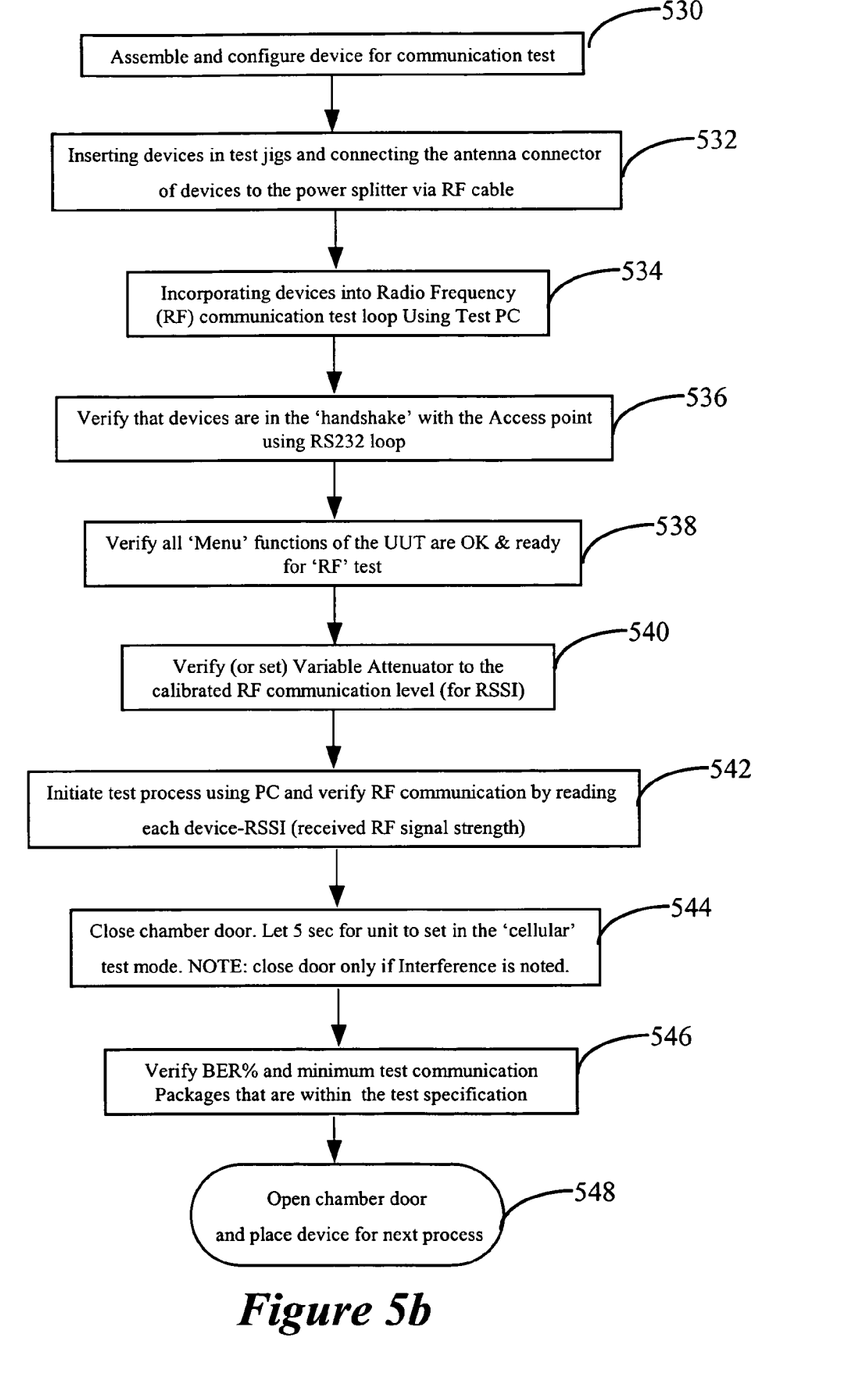
FIG. 5b is a flow chart of a pre-test set-up procedure for a test using an external antenna test port in accordance with a further embodiment of the invention.

FIGS. 5*a* and 5*b* present flow charts of the pre-test set-up procedure to be carried out for an open air and closed circuit test, respectively.

With regard to FIG. 5*a* any assembly of devices is performed and the devices are configured for a communication test at step 502. At step 504 the devices to be tested 404 are placed in the jigs 214 of the test chamber 102 and the devices 404 are turned on. With the device power on the devices 404 attempt to communicate with the RF host or access point 106 using an open-air coupling i.e. via antenna 212. At step 508 it is verified that the devices 404 are in a "handshake" configuration with regard to the access point 106. Data from the devices 404 that is associated with the bench set-up in the test chamber 102, prior to a test, is saved to the PC 104 using the RS232 data lines 109. At step 510 the operator may verify proper operation of the devices 404. At step 512 the variable attenuator 107 is set to the calibrated RF communication Signal level. This is an important step in assuring a proper communication test. At step 514 the test process is initiated at the PC 104 and the Received RF Signal Strength (RSSI) is read for each unit 404. Step 514 assists in detecting a non-operational unit prior to the communication test. The above communication test is operated through the RS232 data lines 109 and it is determined whether the device received the RF signal. Software on the PC 104 will run the communication test with each assigned device being tested and, through the data line 109, read the RF signal value (RSSI) at the device being tested 404.

The chamber door 215 is closed at step 516 and the system is left to "set" in the cellular test mode. At step 518 the Bit Error Rate (BER) % is verified for the minimum test communication packages. The BER % is the statistic read from the access point 106 and is an indication of the RF performance in the chamber 102. If the device 404 does not pass the BER% at this point it is rejected.

The pre-test procedure for a closed circuit test outlined in FIG. 5*b* is quite similar to that of a open-air test outlined in FIG. 5*a*. There are however two differences due to this being a closed circuit test. At step 532 the RF cables 115 are connected to the devices 404 that are to be tested. At step 534 the devices 404 try to communicate with the access point 106 using the RF cable 109.

Figure 6A:
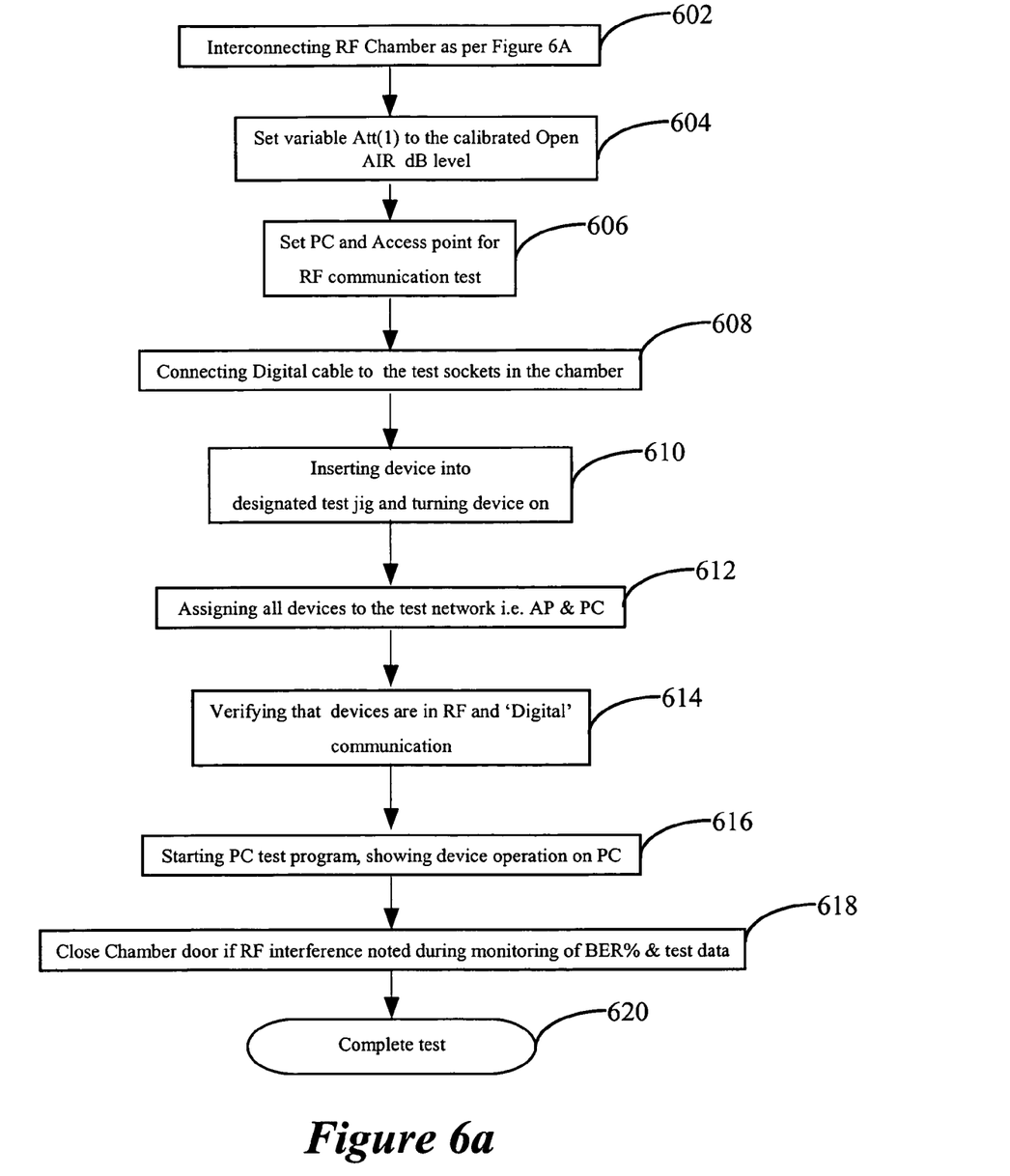
FIG. 6a is a flow chart of a test procedure for an internal antenna test in accordance with a further embodiment of the invention.

Once the device has been set-up as per the methods outlined in FIGS. 5A and 5B the actual RF communication test can be performed. The method of performing an open-air test according to an embodiment of the invention is presented in FIG. 6A. At step 602 RF the test chamber 102 and devices 404 are connected as outlined in FIGS. 1 and 4. The variable attenuator 107 is calibrated to the open-air dB level at step 604. At step 606 the PC 104 and access point 106 are set for an RF communication test. At step 608 the RS232 cable is connected to the jigs 214 in the chamber 102. The devices 404 are inserted in to the appropriate jig 214 and turned on at step 610. At step 612 all of the devices are assigned to the test network i.e. the access point 106 and the PC 104. Verification that the devices 404 are in RF and digital communications is performed at step 614. At step 616 the test program on PC 104 is imitated such that the device operation is visible on PC 104. It RF interference is noted during monitoring of the BER % and the test data the chamber door 215 is closed at step 618. At step 620 the test is stopped after completion thereof or if the test data indicates the test should be stopped.

Figure 6B:
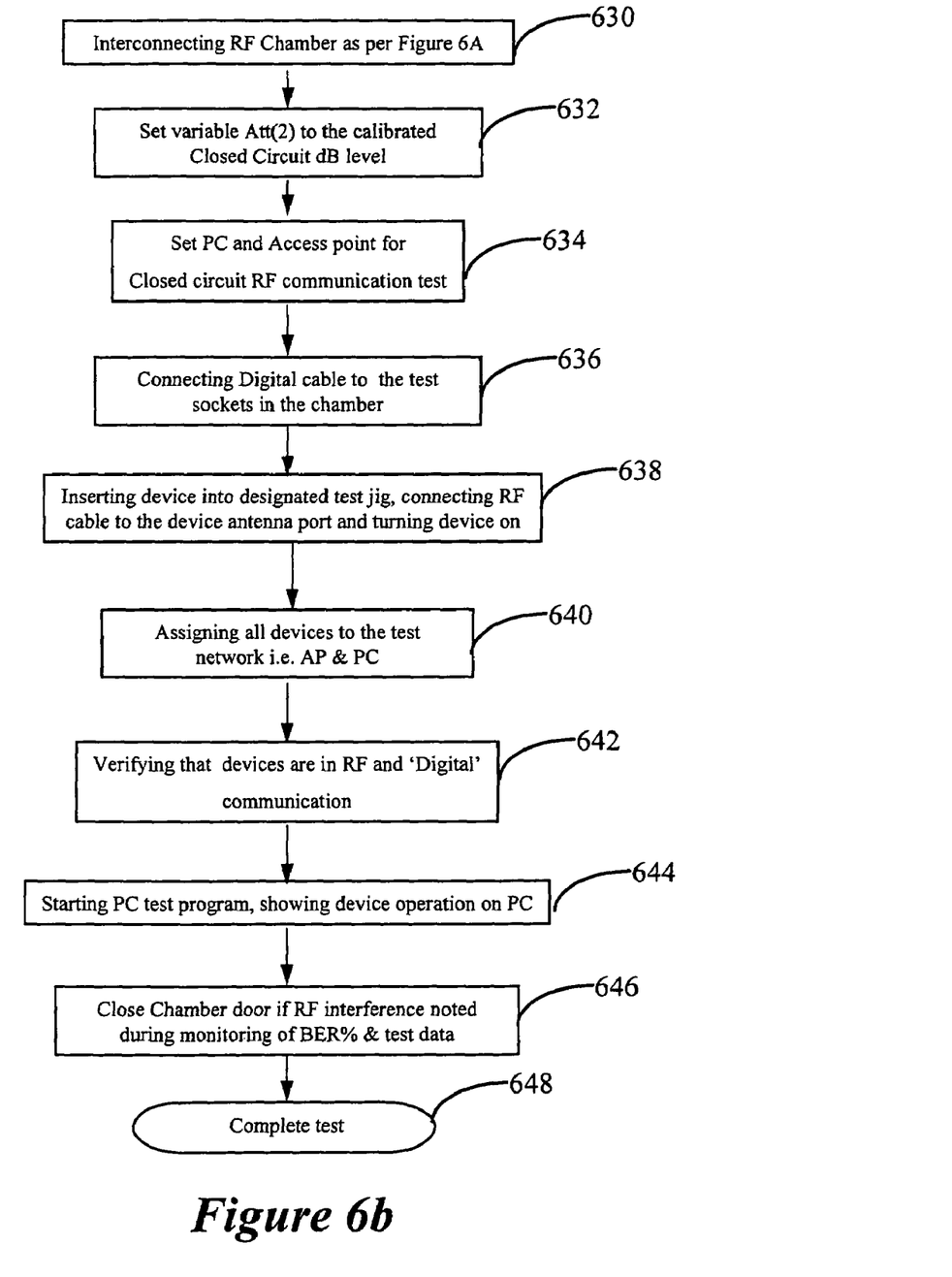
FIG. 6b is a flow chart of a test procedure for an external antenna test in accordance with a further embodiment of the invention.

The test procedure for a closed circuit test is outlined in FIG. 6*b*. The procedure is generally the same as that outlined in FIG. 6*a*. However at step 632 the variable attenuator 107A is calibrated for the closed circuit dB level. At step 634 the PC 104 and the access point 106 are set for a closed circuit RF communication test.

Sample Test Data

The following test data was measured for a typical open-air communication test as per the embodiments of the invention. Attenuation due to Rf interference i.e. ambient' RF exposure was measured up to −85 dB, which is the limit of the test equipment used. Further the VSWR was measured at 1:17. It is noted that all of the above RF measurements were made in the 'working' test areas with a surrounding 'live' RF test and communication on all ranges of frequencies (from UHF to 2.5 GHz).

Table 1 presents measurements of the RSSI of a hand held computer that was tested in accordance with an embodiment of the invention. The internal antenna was operating in the 2.4 GHz operating bandwidth when the data of Table 1 was collected.

TABLE 1

| 802.11 | UUT: RSS per socket (−dBm) | | | | | | |
|---|---|---|---|---|---|---|---|
| CH# | 1 | 2 | 3 | 4 | 5 | 6 | aver |
| 6 | 76 | 79 | 78 | 79 | 78 | | 78 |
| 13 | 78 | 79 | 76 | 79 | 76 | | 77.6 |

In an alternative embodiment the shape of antenna 212 could be an "S" shape and is installed on a side or upper panel of the chamber 102 as per calibration requirements. The positioning of the antenna 212 is a function of the device geometry and device anten 406 whereby the positioning ensures that there is communication between the device antenna 406 and the antenna 212.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A system for testing radio frequency (RF) communications of a device having a device antenna capable of such communications, the system comprising:
    a chamber for isolating the device from RF interference;
    a chamber antenna for providing RF communications with the device antenna for an open air test wherein the chamber antenna is capable of communications over a range of frequencies, the chamber antenna being located within the chamber;

a wired RF communication link connectable to an antenna port of the device for a closed circuit test;

a digital communication link connectable to the device for providing non-RF communications with the device; and a test network for controlling an RF test including the open air test and the closed circuit test for the device, the test network communicating with the device through the digital communication link, communicating with the chamber antenna for the open air test, and being connectable to the device through the wired RF communication link for the closed circuit test.

2. The system according to claim 1, wherein the test network comprises:

a computer connected to the digital communication link; and an access point for providing an RF signal for RF communications with the device, the chamber antenna being connected to the access point.

3. The system according to claim 1 further comprising a jig for holding the device, the jig being located within the chamber and being moved therein for RF tuning to determine a desired distance between the chamber antenna and the device antenna for the open air test.

4. The system according to claim 1 wherein the chamber antenna is a leaky co-axial cable.

5. The system according to claim 4 wherein the chamber antenna has an impedance of approximately 50 ohms.

6. The system according to claim 4 wherein the chamber antenna is capable of receiving an RF communication signal having a frequency between 400 MHz and 3 GHz.

7. The system according to claim 1, further comprising:

an attenuator connected to the chamber antenna for attenuating an RF signal to and from the device antenna, to a calibrated RF signal level.

8. The system according to claim 1, further comprising:

a first attenuator for the open air test, the first attenuator being connected to the chamber antenna for attenuating first RF signal level to and from the device; and a second attenuator for the closed circuit test, the second attenuator being connected to the wired RF communication link for attenuating second RF signal level to and from the device.

9. The system according to claim 8, wherein the test network comprises:

an access point communicating with the first attenuator and the second attenuator for providing an RF test signal; and a computer for communicating with the digital communication link and the access point.

10. The system according to claim 8, wherein the wired RF communication link comprises:

a splitter for connecting the plurality of devices to the second attenuator.

11. The system according to claim 8, wherein the test network comprises:

means for setting the first attenuator to a calibrated RF communication signal level;

means for implementing a communication test for the open air test with the test network; and means for verifying that a bit error rate of the device meets a predetermined RF performance level.

12. The system according to claim 8, wherein the test network comprises:

means for setting the second attenuator to a calibrated RF communication signal level;

means for implementing a communication test associated for the closed circuit test with the test network; and means for verifying that a bit error rate of the device a predetermined RF performance level.

13. The system according to claim 1, further comprising:

a plurality of jigs for holding a plurality of devices, each of the plurality of devices having the device antenna and communicating with the digital communication link and the chamber antenna, each of the plurality of devices being positioned in the chamber by the corresponding jig, depending on RF tuning.

14. The system according to claim 13, wherein the up is moved for the RF tuning to determine a desired distance between the chamber antenna and the device antenna for the open air test.

15. The system according to claim 13, further comprising:

a first attenuator for the open air test, the first attenuator being connected to the chamber antenna for attenuating first RF signal level to and from the device; and a second attenuator for the closed circuit test, the second attenuator being connected to the wired RF communication link for attenuating RF signal level to and from the device.

16. The system according to claim 1, wherein the test network comprises:

means for verifying that the device is in a handshake with the test network.

* * * * *

UNITED STATES PATENT AND TRADEMARK OFFICE
CERTIFICATE OF CORRECTION

PATENT NO. : 7,323,884 B2  
APPLICATION NO. : 11/323635  
DATED : January 29, 2008  
INVENTOR(S) : Stojcevic Page 1 of 1

It is certified that error appears in the above-identified patent and that said Letters Patent is hereby corrected as shown below:

In the Specifications:

In Column 5, Line 49, delete "a open-air" and insert -- an open-air --, therefor.

In Column 6, Line 19, delete "Rf" and insert -- RF --, therefor.

In Column 6, Line 44, delete "anten" and insert -- antenna --, therefor.

In the Claims:

In Column 8, Line 22, in Claim 12, delete "device a" and insert -- device meets a --, therefor.

In Column 8, Line 31, in Claim 14, delete "up" and insert -- jig --, therefor.

Signed and Sealed this  
Twenty-third Day of April, 2013

Teresa Stanek Rea  
*Acting Director of the United States Patent and Trademark Office*